United States Patent

Akimitsu et al.

Patent Number: 5,565,414
Date of Patent: Oct. 15, 1996

[54] SUBSTITUTED SUPERCONDUCTIVE BI-SR-CA-CU OXIDE AND BI-SR-CA-LN-CU OXIDE COMPOSITIONS

[75] Inventors: Jun Akimitsu; Tohru Den, both of Tokyo; Fumio Kishi, Atsugi; Norio Kaneko, Atsugi; Masatake Akaike, Atsugi; Kiyozumi Niizuma, Atsugi; Atsuko Tanaka, Machida, all of Japan

[73] Assignee: Canon Kabushiki Kaisha, Tokyo, Japan

[21] Appl. No.: 347,203

[22] Filed: Nov. 21, 1994

Related U.S. Application Data

[63] Continuation of Ser. No. 32,199, Mar. 15, 1993, abandoned, which is a continuation of Ser. No. 712,995, Jun. 10, 1991, abandoned, which is a continuation of Ser. No. 327,096, Mar. 22, 1989, abandoned.

[30] Foreign Application Priority Data

Mar. 25, 1988 [JP] Japan .................. 63-069738
Mar. 25, 1988 [JP] Japan .................. 63-069739

[51] Int. Cl.$^6$ .......... H01B 12/00; H01L 39/12; C04B 35/45; C04B 35/453
[52] U.S. Cl. .......... 505/121; 505/123; 505/782; 505/784; 252/521
[58] Field of Search .................. 252/518, 521; 505/100, 121, 123, 782, 784

[56] References Cited

U.S. PATENT DOCUMENTS

| | | | |
|---|---|---|---|
| 4,843,059 | 6/1989 | Deslandes | 505/1 |
| 4,880,771 | 11/1989 | Cava et al. | 252/518 |
| 4,952,555 | 8/1990 | Sibata | 505/1 |
| 4,959,348 | 9/1990 | Higashibata | 505/1 |

FOREIGN PATENT DOCUMENTS

| | | |
|---|---|---|
| 0330214 | 3/1989 | European Pat. Off. |
| 0327044 | 8/1989 | European Pat. Off. |
| 0336450 | 10/1989 | European Pat. Off. |

OTHER PUBLICATIONS

Fukushima et al. "Electrical and Magnetic Properties in $Bi_2Sr_2Ca_{1-x}Y_xCa_2O_{8+\delta}$" Jap. Journ. of App. Phys. vol. 27, No. 8, Aug. 1988 pp. L1432–L1434.

Yoshizaki et al. "Superconducting and Magnetic Properties of $Bi_2Sr_2Ca_{1-x}Y_xCu_2O_y$ . . . " Physica C., 152, May 1988. pp. 408–412.

Robinson "Effect of Oxidizing Atmosphere On . . . $KBa_2Ca_{3-x}B_xO_2$" Mat. Res. Soc. Symp. Proc. v. 99 Nov./Dec. 1987, pp. 587–590.

Murphy "New Superconducting Cuprate Perovskites" Physical Review Lett. v. 58 (18) May 4, 1987 pp. 1889–1890.

Xin "A Study of Superconducting Oxide Y—Ba—Cu—Sn—O" Int'nl Jnl Modern Physics B vol., No. 2 1987 pp. 277–280.

(List continued on next page.)

Primary Examiner—Douglas J. McGinty
Assistant Examiner—M. Kopec
Attorney, Agent, or Firm—Fitzpatrick, Cella, Harper & Scinto

[57] ABSTRACT

A metal oxide is provided which is represented by the compositional formula:

$$(Bi_{1-x}A'_x)_2(Sr_yCa_{1-y-z}A''_z)_p(Cu_{1-r}A'''_r)_qO_\delta$$

wherein $0 \leq x \leq 0.5$, $0.3 \leq y \leq 0.7$, $0 \leq z \leq 0.5$, $0 \leq r \leq 0.1$, $1 > y+z$, $2 > p > 11$, $1 \leq q \leq 10$ and $5.4 \leq \delta \leq 24$ with the exclusion of $x=z=r=0$, $A'$ is at least one element selected from In, Sb, Pb and Sn; $A''$ is at least one element selected from Na, K, Mg, Ba, and Sn and $A'''$ is at least one element selected from Ti, V, Cu, Ni, Zr, Nb, Ta, Fe and Ru. The metal oxide may further comprise an element selected from lanthanoids and yttrium. The metal oxide material shows superconductivity at a temperature not lower than the boiling point of liquid helium.

6 Claims, 1 Drawing Sheet

OTHER PUBLICATIONS

Hazen, R. M. et al.: "Superconductivity . . . Phase Identification", *Phys. Rev. Lett*, 60, No. 12, Mar. 21, 1988, pp. 1174–1177.

Subramanian, M. A. et al.: "A New . . . $Bi_2Sr_{3-x}Ca_xCu_2O_{8+y}$", *Science*, vol. 239, Feb. 26, 1988, pp. 1015–1017.

Cava, R. J. et al.: "Studies of . . . Bi(Pb)—Sr—Ca—Cu—O", *Physia C.*, 153–155, 1988, pp. 560–565.

Sampathkumaran, E. V. et al.: "Influence . . . System $Bi_4Ca_3Sr_3Cu_4O_y$", *J. Phys. F: Met. Phys.*, 18, 1988, pp. L163–L167.

Matsui, Y., et al.: "Possible Model of . . . Bi—Ca—Sr—Cu—O System", *Jap. J. Appl. Phys.*, vol. 27, No. 3, Mar. 1988, pp. L372–L375.

Nakao, M. et al.: "Magnetron Sputtering of Bi—Ca—Sr—O . . . ", *Jap. J. Appl. Phys.*, vol. 27, No. 3, Mar. 1988, pp. L378–L380.

Togano, K. et al.: "Preparation of . . . Bi—Sr—Ca—Cu—O Superconductors", *Jap. J. Appl. Phys.*, vol. 27, No. 3, Mar. 1988, pp. L323–L324.

Adachi, S. et al.: "Superconducting . . . Bi—Sr—Ca—Cu—O System", *Jap. J. Appl. Phys.*, vol. 27, No. 3, Mar. 1988, pp. L344–L346.

Maeda, H. et al.: "A New High–$T_c$ Oxide . . . without Rare Earth Element", *Jap. J. Appl. Phys.*, vol. 27, No. 2, Feb. 1988, pp. L209–L210.

Takano, M. et al.: "High $T_c$ . . . Bi, Pb—Sr—Ca—Cu—O System", *Jap. J. Appl. Phys.*, vol. 27, No. 6, Jun. 1988, pp. L1041–L1043.

Mizuno, M. et al.: "Superconductivity of $Bi_2Sr_2Ca_2Cu_3Pb_xO_y$", *Jap. J. Appl. Phys.*, vol. 27, No. 6, Jul. 1988, pp. L1225–L1227.

Oda, Y., et al.: "Superconductivity of $Y_1Ba_2(Cu_{1-x}Fe_x)_3O_y$", *Jap. J. Appl. Phys.*, vol. 26, No. 10, Oct. 1987, pp. L1660–L1663.

Kishio, K., et al.: "Effect of Lanthanide Ion Substitutions . . . ", *Jap. J. Appl. Phys.*, vol. 26, No. 4, Apr. 1987, pp. L391–L393.

Takayama–Muromachi, E. et al.: "Superconductivity of $YBa_2Cu_{3-x}M_xO_y$", *Jap. J. Appl. Phys.*, vol. 26, No. 12, Dec. 1987, pp. L2087–L2090.

Takayama–Muromachi, E. et al.: "Identification . . . Bi—Ca—Sr—Cu—O . . . ", *Jap. J. Appl. Phys.*, vol. 27, No. 3, Mar. 1988, pp. L365–L368.

Chu, C. W. et al. "Superconductivity . . . without Rare Earth Elements", *Phys. Rev. Lett.*, 60, No. 10, Mar. 7, 1988, pp. 941–943.

SUBSTITUTED SUPERCONDUCTIVE BI-SR-CA-CU OXIDE AND BI-SR-CA-LN-CU OXIDE COMPOSITIONS

This application is a continuation of application Ser. No. 08/032,199 filed Mar. 15, 1993, now abandoned, which is a continuation application of continuation application of Ser. No. 07/327,096, filed Mar. 22, 1989, now abandoned.

BACKGROUND OF THE INVENTION

1. Field of the Invention

The present invention relates to a metal oxide material, and particularly to a metal oxide material useful as a superconductive material.

2. Related Background Art

Among copper oxides, materials represented by the compositional formulas $La_{2-x}A_xCuO_4$ (where A is Ca, Sr or Ba), $YBa_2Cu_3O_y$ and $SrBiCuO_y$ are known as superconductive materials.

However, in the conventional superconductive materials comprising copper oxides, the yttrium and lanthanoids that are component elements of the materials have been expensive because of their small estimated reserves. In instances in which these copper oxides are formed into sintered compacts or thin films in accordance with the applications, high temperatures of about 1,000° C. are required as the reaction temperature, resulting in the disadvantages of a high production cost and considerable limitations on the substrates. Moreover, they can also be formed into single crystals with difficulty, and under narrow reaction conditions, so that no large crystal has ever been obtained. Furthermore, deviation in compositional ratios may greatly affect the superconductivity transition temperature (hereinafter "Tc"), causing the problem that the materials exhibit no superconductivity within a certain range, for example, at $x \geq 0.2$ in $Y_{1+x}Ba_{2-x}Cu_3O_7$. This is particularly a serious serious problem since the compositional deviation becomes liable to occur when thin films are prepared.

Relating to the material represented by the compositional formula: $SrBiCuO_y$, Z. Phys. B-Condensed Matter 68, 421–423 (1987) discloses a material, having its composition of $Sr_2Bi_2Cu_2O_{7+\delta}$, and Tc of 7 to 22K. in the midpoint. This Bi-based superconductive material does not employ any expensive starting materials such as Y and lanthanoids as its component elements, can be formed using reaction temperatures of not higher than 900° C., can be inexpensive in comparison with conventional $La_{2-x}A_xCuO_4$ and $LnBa_2Cu_3O_y$, and can afford to accept a broader scope of selection in respect of the materials for substrates when thin films are formed, and thus can be said to be superior materials in these respects. They, however, have the Tc that tends to be extremely lowered by contamination with impurities, and it is difficult to obtain a superconductive material having a stable Tc not lower than the boiling point of liquid helium (4.2 K.), so that it is required to use starting materials purified to a high degree.

Japanese Journal of Applied Physics, Vol. 27, February, 1988, pp.L209-L210, discloses a Bi-based $BiSrCaCu_2O_x$, and Tc of 120 K. at on-set temperature and superconductive material having its composition of 75 K. at zero-resistance temperature, and moreover suggests the possibility that the zero-resistance temperature shifts to 105 K. at the compositional ratio of Bi:Sr:Ca=1:1:1. However, in a superconductive material having the composition of $BiSrCaCu_2O_x$, the zero resistance is not achieved at 105 K., but the zero resistance is achieved after another transition has further appeared at the lower temperature side. Even in the transition at the lower temperature side the transition temperature range is as broad as about 10 K, showing that the material has no good uniformity. This cannot bring about a sufficient reproducibility when the materials is used as a device having a fine structure.

The above superconductive material also has a lower critical magnetic field of as low as 5 Oe (oersted) at a temperature of about 55 K., and is not satisfactory for use in a magnetic shield. Thus, there remain problems to be solved.

SUMMARY OF THE INVENTION

An object of the present invention is to provide a novel copper oxide material that may not require any expensive starting material such as lanthanoids.

Another object of the present invention is to provide a novel superconductive copper oxide material that can be formed at a low reaction temperature and enables easy preparation of single crystals.

Still another object of the present invention is to provide a copper oxide material useful as a superconductive material whose Tc can be less affected even by the compositional deviation.

A further object of the present invention is to provide a copper oxide material useful as a superconductive material that can be readily cooled by liquid helium and/or liquid nitrogen.

A still further object of the present invention is to obtain a copper oxide material that can prevent Tc from being deteriorated because of a small amount of impurities and can be prepared by using ordinary starting materials of not particularly high purity.

A still further object of the present invention is to provide a copper oxide material that has a raised lower critical magnetic field and can be utilized as a magnetic shield material.

All the above objects can be achieved by the present invention described below.

The present invention provides a metal oxide material, represented by the compositional formula:

$$Bi_2(Sr_{1-x}Ca_x)_{3+n}Cu_{2+n}O_{(12+3n)-\delta}$$

wherein $0<x<1$, $0<n\leq 10$, and $0<\delta$.

In another embodiment, the present invention provides a metal oxide material, comprising bismuth, strontium, calcium, copper and oxygen, wherein said metal oxide material further comprises at least one element selected from the elementary group consisting of Groups Ia, IIa, IVa, Va, VIa, VIII, IIIb, IVb and Vb of the periodic table.

In a preferred embodiment of the above embodiment, the present invention provides a metal oxide material, represented by the compositional formula:

$$(Bi_{1-x}A'_x)_2(Sr_yCa_{1-y-z}A''_z)_p(Cu_{1-r}A''_r)_p(Cu_{1-r}A'''_r)_qO_\delta$$

wherein $0\leq x\leq 0.5$, $0.3\leq y\leq 0.7$, $0\leq z\leq 0.5$, $0\leq r\leq 0.1$, $1>y+z$, $2\leq p\leq 11$, $11\leq q\leq 10$ and $5.4\leq\delta\leq 24$; $A'$ is at least one element selected from the elementary group consisting of Groups IIIb, IVb and Vb; $A''$ is at least one element selected from the elementary group consisting of Groups Ia, IIa and IVb; and $A'''$ is at least one element selected from the elementary group consisting of Groups IVa, Va, VIa and VIII.

In still another embodiment, the present invention provides a metal oxide material, comprising bismuth, strontium, calcium, copper and oxygen, wherein said metal oxide material further comprises at least one element selected from the elementary group consisting of Groups Ia, IIa, IVa, Va, VIa, VIII, IIIb, IVb and Vb of the periodic table, and at least one element selected from the elementary group consisting of lanthanoids and yttrium.

In a preferred embodiment of the above embodiment, the present invention provides a metal oxide material, represented by the compositional formula:

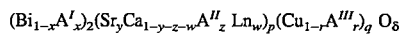

wherein $0 \leq x \leq 0.5$, $0.3 \leq y \leq 0.7$, $0 \leq z \leq 0.5$, $0 \leq r \leq 0.1$, $0 \leq w \leq 0.4$, $1 > y+z+w$, $2 \leq p \leq 11$, $1 \leq q \leq 10$ and $5.4 \leq \delta \leq 24$; $A^I$ is at least one element selected from the elementary group consisting of Groups IIIb, IVb and Vb; $A^{II}$ is at least one element selected from the elementary group consisting of Groups Ia, IIa and IVb; $A^{III}$ is at least one element selected from the elementary group consisting of Groups IVa, Va, VIa and VIII; and Ln is at least one element selected from lanthanoids and yttrium.

DETAILED DESCRIPTION OF THE PREFERRED EMBODIMENTS

Figure 1:
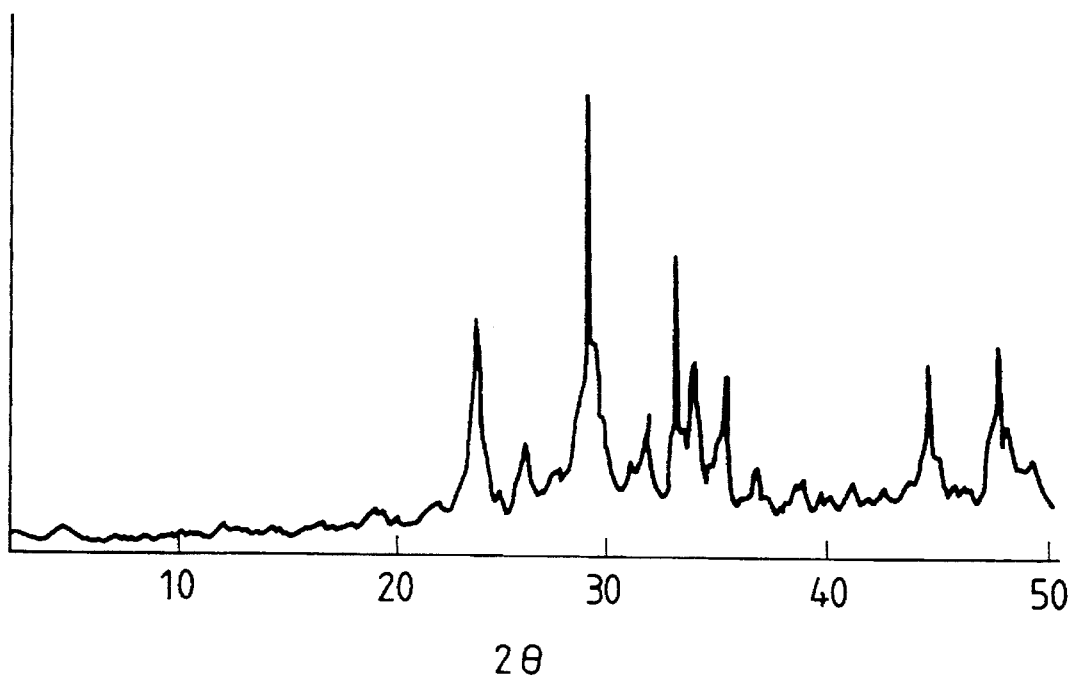
FIG. 1 shows a result of X-ray diffraction of a metal oxide material according to the present invention.

The metal oxide material of the present invention can be roughly grouped into three embodiments as described below in detail.

A first embodiment of the present invention is a metal oxide material represented by the compositional formula $Bi_2(Sr_{1-x}Ca_x)_{3+n}Cu_{2+n}O_{(12+3n)-\delta}$ and wherein $0 < x < 1$, $0 < n \leq 10$, and $0 < \delta$, and is a metal oxide material having a layer structure in which a layer analogous to an oxygen-deficient perovskite is positioned between $(Bi_2O_2)^{2+}$ layers (hereinafter the metal oxide material [I] of the present invention).

The metal oxide materials [I] of the present invention have of course a high Tc value particularly with the above compositional ratio, and also, even when used in devices having a fine structure, can attain a sufficient reproducibility of device characteristics because of its transition temperature range as narrow as 7 K. or less with good uniformity of materials.

In the above compositional ratio of the metal oxide materials [I] of the present invention, a material of $1 \leq n \leq 3$ and $0.45 \leq x \leq 0.55$ is particularly preferred since it shows a value as high as 110 or more also in respect of the Tc value of the material.

If only the above reproducibility of device characteristics is noticed, the transition temperature width should preferably be not more than 5 K., and more preferably not more than 3 k.

In a second embodiment of the present invention, the metal oxide material comprises bismuth, strontium, calcium, copper and oxygen, and additionally comprises at least one element selected from the elementary group consisting of Groups Ia, IIa, IVa, Va, VIa, VIII, IIIb, IVb and Vb (hereinafter the metal oxide material [II] of the present invention).

The metal oxide material [II] of the present invention contains in addition to the five elements consisting of bismuth, strontium, calcium, copper and oxygen, the sixth element (or further seventh, eighth and so forth elements) belonging to the above Groups in the periodic table, so that it can have not only a transition temperature width of 7 K. or less which is the characteristics of the metal oxide material [I] of the present invention, but also a lower magnetic field of not less than 10 Oe, and more preferably not less than 15 Oe. This enables the metal oxide material [II] of the present invention to be used even in a higher electric field when used as a magnetic shield.

The metal oxide materials [II] of the present invention are expressed by the compositional formula:

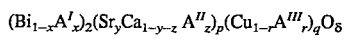

and wherein $0 \leq x \leq 0.5$, $0.3 \leq y \leq 0.7$, $0 \leq z \leq 0.5$, $0 \leq r \leq 0.1$, $1 \leq y+z$, $2 \leq p \leq 11$, $1 \leq q \leq 10$ and $5.4 \leq \delta \leq 24$; $A^I$ is at least one element selected from the elementary group consisting of Groups IIIb, IVb and Vb; $A^{II}$ is at least one element selected from the elementary group consisting of Groups Ia, IIa and IVb; and $A^{III}$ is at least one element selected from the elementary group consisting of Groups IVa, Va, VIa and VIII. Here, particularly taking account as well of the uniformity of materials mentioned above, the material may preferably have a compositional ratio of $p=3+n$, $q=2+n$ and $0 \leq n \leq 8$, within the compositional ratio of which the material exhibits the same layer structure as the metal oxide material (I) of the present invention.

Of the above elements $A^I$ $A^{II}$ and $A^{III}$, particularly preferred are Na and K, belonging to Group Ia; Mg and Ba, belonging to Group IIa; Ti and Zr, belonging to Group IVa; V, Nb and Ta, belonging to Group Va; Cr, belonging to Group VIa; Fe, Ru and Ni, belonging to Group VIII; In, belonging to Group IIIb; Sn, belonging to Group IVa; and Sb, belonging to Group Vb. Na and K also have the action of lowering the melting point, and are more advantageous for the preparation of single crystals.

In a third embodiment of the present invention, the metal oxide material comprises bismuth, strontium, calcium, copper and oxygen, wherein said metal oxide material further comprises at least one element selected from the elementary Group consisting of Groups Ia, IIa, IVa, Va, VIa, VIII, IIIb, IVb and Vb of the periodic table, and at least one element selected from the elementary Group consisting of lanthanoids and yttrium (hereinafter "the metal oxide material [III] of the present invention"). Namely, the metal oxide material [III] of the present invention contains at least one element selected from the elementary group consisting of lanthanoids and yttrium in addition to the elements contained in the above metal oxide material [II] of the present invention, so that this can attain the effect of raising Tc to a level of about 5 to 10 K., in addition to the characteristics that the transition temperature width is 7 or less and the lower magnetic field is not less than 10 Oe.

The metal oxide material [III] of the present invention is expressed by the compositional formula:

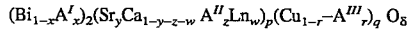

and wherein $0 \leq x \leq 0.5$, $0.3 \leq y \leq 0.7$, $0 \leq z \leq 0.5$, $0 \leq r \leq 0.1$, $0 < w \leq 0.4$, $1 > y+z+w$, $2 \leq p \leq 11$, $1 \leq q \leq 10$ and $5.4 \leq \delta \leq 24$; $A^I$ is at least one element selected from the elementary group consisting of Groups IIIb, IVb and Vb; $A^{II}$, Groups Ia, IIa and IVb-$A^{III}$, IVa, Va, VIa and VIII; and Ln is at least one element selected from lanthanoids and yttrium. Particularly taking account of the uniformity, the materials preferably have a compositional ratio of p=3+n, q=2+n and 0≦n≦8, within the compositional ratio of which the material exhibits the same layer structure as the metal oxide material [I] of the present invention.

Of the above elements $A'$, $A''$ and $A'''$, particularly preferred are Na and K, belonging to Group Ia; Mg and Ba, belonging to Group IIa; Ti and Zr, belonging to Group IVa; V, Nb and Ta, belonging to Group Va; Cr, belonging to Group VIa; Fe, Ru and Ni, belonging to Group VIII; In belonging to Group IIIb; Sn, belonging to Group IVb; Sb, belonging to Group Vb; and Y, Er and La, belonging to Ln. Na and K also have the action of lowering the melting point, and are more advantageous for the preparation of single crystals.

As methods of preparing the above metal oxide materials [I], [II] and [III] of the present invention, it is possible in the present invention to use any of reactions and sintering methods utilizing the heating of starting material powders commonly used in so-called ceramic materials.

Examples of such methods are disclosed in Material Research Bulletin, Vol. 8, p.777 (1973); Solid State Communication, Vol. 17, p.27 (1975); Zeitschrift für Physik, Vol. B-64, p.189 (1986); Physical Review Letters, Vol. 58, No. 9, p.908 (1987); etc., which methods are presently known as qualitatively very common methods.

A method of effecting single-crystal growth after a starting material powder has been fused at a high temperature is also applicable in the present invention. Also, the material of the present invention may be formed on a substrate in the form of a thin film with use of sputtering using a target containing starting materials such as high frequency sputtering or magnetron sputtering, electron beam vapor deposition, or other vacuum vapor deposition, as well as a cluster ion beam method, or CVD or plasma CVD employing gaseous materials as starting materials. In such instances, it is often effective to feed gaseous oxygen to carry out oxidation in situ. More specific examples of conditions for the preparation will be described in Examples herein sex out below.

The above described metal oxide materials [I], [II] and [III] of the present invention can bring about the following effects:

(1) A copper oxide material having a high Tc can be obtained without using rare earth elements at all or in a large quantity, but using inexpensive materials.

(2) The materials can be obtained at a reaction temperature of 900° C. or lower and also has a melting point of 900° C. or less. This is very advantageous in forming them into thin films, and also advantageous in preparing single crystals.

(3) Compared with, for example, a series of compounds typified by $YBa_2Cu_3O_{7-\delta}$, the present materials have a superior stability in the air and may suffer relatively less deterioration caused by humidity.

(4) A practically useful copper oxide material can be obtained whose superconductivity transition temperature can be less affected even by the deviation in compositional ratios.

(5) Starting materials purified in a particularly high degree are not required, since the Tc is not affected by impurities if they are present in a small amount.

(6) The material of the present invention can be effective with a relatively inexpensive helium-circulating type refrigerator (achieving approximately 20 K.) since the materials have Tc between 60 K. and 130 K. in terms of a midpoint.

(7) Materials can be obtained with uniform superconductive characteristics.

(8) The lower critical magnetic field can be raised.

EXAMPLES

The present invention will be described below in greater detail by giving Examples and Comparative Examples. In the following, Tc (critical temperature value) indicates a value at the midpoint.

Examples 1 to 9, Comparative Example 1

$Bi_2O_3$, $SrCO_3$, $CaCO_3$ and $CuO$ as starting materials were weighed to give the desired compositional ratios, followed by mixing under a dry condition.

The resulting mixtures were first reacted at 800° C. in the atmosphere. The resulting reaction mixtures were ground into powder in a agate motor, and pressure-molded into pellets of 10 mm in diameter and 1 mm in thickness. The molded products were heat-treated at 850° C. in an oxidative atmosphere, thus preparing metal oxide materials of the present invention.

Analyses of composition of the materials thus prepared were carried out according to a plasma emission analysis. The results obtained are shown in Table 1. An X-ray diffraction pattern of Sample 2 is shown in FIG. 1. Although some impurity peaks are observed, the sample was a material comprised of a principal phase having a tetragonal substantially tetragonal structure of a=5.4 Å and c=36 Å approximately.

In the instance of Sample 1, it was found to be a=5.4 Å and c=30 Å approximately. The difference in lattice constant C is presumably because a perovskite structure comprising Sr, Ca and Cu has increased by one unit. Accordingly, these materials are presumed to have a series of structures comprising a $(Bi_2O_2)^{2+}$ layer and a layer of the perovskite structure.

If the portion of the perovskite structure is assumed to have a usual amount of oxygen, the portion of the structure is assumed to be deficient in oxygen for the charge balance.

TABLE 1

| | Compositional ratio* | | | | Critical temp. | Transition temp. width |
|---|---|---|---|---|---|---|
| | Bi | Sr | Ca | Cu | (K) | (K) |
| Sample No. | | | | | | |
| 1 | 2.00 | 1.48 | 1.52 | 2.00 | 85 | 5 |
| 2 | 2.00 | 2.12 | 1.88 | 3.00 | 110 | 3 |
| 3 | 2.00 | 2.39 | 2.61 | 4.00 | 125 | 5 |
| 4 | 2.00 | 3.02 | 2.98 | 5.00 | 120 | 7 |
| 5 | 2.00 | 3.33 | 3.67 | 6.00 | 100 | 5 |
| 6 | 2.00 | 3.99 | 3.01 | 7.00 | 98 | 5 |
| 7 | 2.00 | 5.02 | 3.98 | 8.00 | 95 | 5 |
| 8 | 2.00 | 5.01 | 4.99 | 9.00 | 90 | 3 |
| 9 | 2.00 | 4.50 | 6.50 | 10.00 | 90 | 5 |
| Comparative Example: | | | | | | |
| 1 | 2.00 | 2.00 | 2.00 | 4.00 | 85 | 15 |

*The compositional ratio is indicated as relative composition when the Bi component is assumed as 2.00.

Examples 10 to 24, Comparative Examples 2 to 5

Starting materials were weighed to give the compositional ratios as shown in Table 2, and mixed under a dry condition. As the starting materials, carbonates such as $Na_2CO_3$ and $SrCO_3$ were used in respect of the alkaline metal elements and alkaline earth elements, and oxides such as $Bi_2O_3$, CuO, PbO and $La_2O_3$ were used in respect of other elements.

These mixtures were each pressure-molded into pellets with a diameter of 10 mm and a thickness of 1 mm, and the molded products were placed on an alumina boat and subjected to reaction and sintering in the atmosphere. The reaction and sintering were carried out at a temperature of 760° C. in respect to Examples 7 to 9 and Comparative Example 2, and 880° C. in respect to other examples. The samples thus prepared were measured for their resistance at a temperature range of from room temperature to 60 K. to determine Tc. The results are shown in Table 2. The mark "- - -" in the column for Tc indicates that no superconductivity transition took place at 60 K. or more.

TABLE 2

| Sample- No. | Components (molar ratio) | | | | | Tc(K) | Lower critical magnetic field (55K) [Oe] | m.p. (°C.) |
| --- | --- | --- | --- | --- | --- | --- | --- | --- |
| | Bi | Sr | Ca | Cu | Fifth element | | | |
| Example: | | | | | | | | |
| 10 | 0.70 | 1.00 | 1.00 | 2.00 | In 0.30 | 80 | 10 | |
| 11 | 0.50 | 1.00 | 1.00 | 2.00 | In 0.50 | 82 | 15 | |
| 12 | 0.90 | 0.80 | 0.80 | 1.00 | Sb 0.10 | 83 | 13 | |
| 13 | 0.70 | 1.00 | 1.00 | 2.00 | Pb 0.30 | 85 | 20 | |
| 14 | 0.50 | 1.00 | 1.00 | 2.00 | Pb 0.50 | 80 | 20 | |
| 15 | 1.00 | 1.00 | 0.70 | 2.00 | Na 0.30 | 83 | 10 | 740 |
| 16 | 1.00 | 1.00 | 0.50 | 2.00 | Na 0.50 | 82 | 10 | 710 |
| 17 | 1.00 | 1.00 | 0.90 | 2.00 | K 0.10 | 77 | 10 | 790 |
| 18 | 1.00 | 1.00 | 0.90 | 2.00 | Mg 0.10 | 80 | 12 | |
| 19 | 1.00 | 1.00 | 0.90 | 2.00 | Ba 0.10 | 78 | 13 | |
| 20 | 1.00 | 0.90 | 1.00 | 2.00 | Sn 0.10 | 77 | 10 | |
| 21 | 1.00 | 1.00 | 1.00 | 1.80 | Ti 0.20 | 80 | 20 | |
| 22 | 1.00 | 1.00 | 1.00 | 1.80 | V 0.20 | 80 | 17 | |
| 23 | 1.00 | 1.00 | 1.00 | 1.80 | Cr 0.20 | 80 | 16 | |
| 24 | 1.00 | 0.80 | 0.80 | 1.80 | Ni 0.20 | 70 | 17 | |
| Comparative Example: | | | | | | | | |
| 2 | 0.30 | 1.00 | 1.00 | 2.00 | In 0.70 | — | — | |
| 3 | 1.00 | 1.00 | 0.30 | 2.00 | Na 0.70 | — | — | |
| 4 | 1.00 | 1.00 | 1.00 | 1.50 | Ti 0.50 | — | — | |
| 5 | 1.00 | 1.00 | 1.00 | 2.00 | — — | 85 | 3 | 890 |

Examples 25 to 39

Using $Bi_2O_3$, $SrCO_3$, $CaCO_3$, PbO, $Na_2CO_3$, MgO, $K_2CO_3$, $Y_2O_3$, $Er_2O_3$, $GeO_2$, CuO, $TiO_2$, $ZrO_2$, $V_2O_3$, $Nb_2O_3$, $Ta_2O_3$, $RuO_2$ and $Fe_2O_3$ as starting materials, heat treatment was carried out in the same manner as in Example 1. However, the second heat treatment was carried out at 890° C. in the instances where $TiO_2$, $ZrO_2$, $Nb_2O_3$, $Ta_2O_3$ and $RuO_2$ were used.

Analyses of composition of the samples thus prepared were carried out according to a plasma emission analysis, and the temperature dependence of electrical resistance was examined in the same manner as Example 1 to find that all the samples were confirmed to exhibit the superconductivity. Results obtained are shown in Table 3.

Example 40

An example is shown in which a thin film comprised of the material of the present invention is formed by electron beam vapor deposition. Metallic Bi, St, Ca and Cu as vaporizing materials are respectively put in independent four electron beam heating units provided in a vacuum container with a degree of vacuum of $2 \times 10^{-6}$ Torr or less. Each of these metals is irradiated with electron beams and heated. Using a film thickness monitor disposed in the vicinity of each heating unit, the intensity of electron beams is controlled so that the Bi=Sr=Ca:Cu ratio may come to be 2:1.5:1.5=2 (Sample 1) or 2:1.5:2.5:3 (Sample 2).

Using an $SrTiO_3$ single crystal as a substrate, vapor deposition is carried out with the above compositional ratio while heating the substrate to 600° C. and also feeding oxygen gas to the neighborhood of the substrate at a rate of 10 to 20 ml/min.

The deposition rate was 0.5 to 3 Å/sec for each of the metallic materials, and total rate was 2 to 10 Å/sec. The deposited films had a thickness of 100 to 10,000 Å, in each case of which the electrical resistance turned zero at 73 K. for Sample 1, and at 75 K. or less for Sample 2.

TABLE 3

| Sample | Bi | Sr | Ca | Na | K | Mg | Y | Er | La | Cu | Ti | Zr | V | Nb | Ta | Ru | Fe | Tc(K) | Lower critical magnetic field [55K] (Oe) |
|---|---|---|---|---|---|---|---|---|---|---|---|---|---|---|---|---|---|---|---|
| 25 | 2.00 | 1.50 | 1.50 | | | | | | | 1.50 | 0.50 | | | | | | | 60 | 20 |
| 26 | 2.00 | 1.50 | 1.00 | 0.50 | | | | | | 2.00 | | | | | | | | 84 | 12 |
| 27 | 2.00 | 1.00 | 2.00 | | 1.00 | | | | | 2.90 | | 0.10 | | | | | | 82 | 12 |
| 28 | 2.00 | 2.00 | 3.00 | | | | | | | 3.90 | | | | | | | 0.10 | 80 | 20 |
| 29 | 2.00 | 3.00 | 2.50 | | | 0.50 | | | | 5.00 | | | | | | | | 114 | 18 |
| 30 | 2.00 | 1.50 | 1.00 | | | 0.50 | | | | 2.00 | | | | | | | | 130 | 18 |
| 31 | 2.00 | 3.00 | 2.90 | | | | 0.10 | | | 4.80 | | | | | | 0.20 | | 122 | 10 |
| 32 | 2.00 | 3.00 | 3.90 | | | | | 0.10 | | 5.80 | | | | | | 0.20 | | 126 | 10 |
| 33 | 2.00 | 4.00 | 2.50 | | | 0.50 | | | | 5.70 | | | 0.30 | | | | | 95 | 15 |
| 34 | 2.00 | 4.00 | 4.00 | 1.00 | | | | | | 7.90 | | | | 0.10 | | | | 90 | 13 |
| 35 | 2.00 | 5.00 | 4.00 | 0.90 | | 0.10 | | | | 8.80 | | | | | | | 0.20 | 72 | 20 |
| 36 | 2.00 | 7.20 | 3.40 | | | | | | 0.40 | 9.50 | | | | | 0.50 | | | 66 | 15 |
| 37 | 2.00 | 3.00 | 3.00 | | | | | | | 4.80 | | | | | | | 0.20 | 65 | 10 |
| 38 | 2.00 | 3.00 | 4.00 | | | | | | | 5.80 | | | | | | | 0.20 | 67 | 10 |
| 39 | 2.00 | 7.20 | 3.80 | | | | | | | 9.50 | | | | | 0.50 | | | 61 | 15 |

We claim:

1. A metal oxide material represented by the compositional formula:

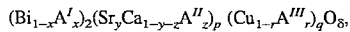

wherein $0 \leq x \leq 0.5$, $0.3 \leq y \leq 0.7$, $0 \leq z \leq 0.5$, $0 \leq r \leq 0.1$, $1 \leq y+z$, $2 \leq p \leq 11$, $1 \leq q \leq 10$ and $5.4 \leq \delta \leq 24$, with the exclusion of $x=z=r=0$, wherein $A^I$ is at least one element selected from the elementary group consisting of In and Sb, wherein $A^{II}$ is at least one element selected from the group consisting of Mg, Ba and Sn, and wherein $A^{III}$ is at least one element selected from the group consisting of Ti, V, Cr and Ni.

2. The metal oxide material according to claim 1, which shows superconductivity at a temperature not lower than the boiling point of liquid helium.

3. The metal oxide material according to claim 1, comprising $(Bi_2O_2)^{2+}$ layers and oxygen-defected perovskite layers, and having a layer structure in which the oxygen-deficient perovskite layer is positioned between $(Bi_2O_2)^{2+}$ layers.

4. A metal oxide material represented by the compositional formula:

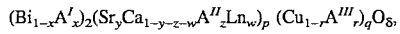

wherein $0 \leq x \leq 0.5$, $0.3 \leq y \leq 0.7$, $0 \leq z \leq 0.5$, $0 \leq r \leq 0.1$, $0 \leq w \leq 0.4$, $1 < y+z+w$, $2 \leq p \leq 11$, $1 \leq q \leq 10$ and $5.4 \leq \delta \leq 24$, exclusion of $x=z=r=0$, wherein $A^I$ is at least one element selected from the group consisting of In and Sb, wherein $A^{II}$ is at least one element selected from the group consisting of Mg, Ba and Sn, and wherein $A^{III}$ is at least one element selected from the group consisting of V, Cr and Ni, and Ln is at least one element selected from Y, Er and La.

5. The metal oxide material according to claim 4, which shows superconductivity at a temperature not lower than the boiling point of liquid helium.

6. The metal oxide material according to claim 4, comprising $(Bi_2O_2)^{2+}$ layers and oxygen-deffective perovskite layers, and having a layer structure in which the oxygen-deficient perovskite layer is positioned between $(Bi_2O_2)^+$ layers.

* * * * *

UNITED STATES PATENT AND TRADEMARK OFFICE
CERTIFICATE OF CORRECTION

PATENT NO. : 5,565,414
DATED : October 15, 1996
INVENTOR(S) : JUN AKIMITSU ET AL.   Page 1 of 3

It is certified that error appears in the above-identified patent and that said Letters Patent is hereby corrected as shown below:

On title page,

AT [56] REFERENCES CITED

Foreign Patent Documents,
"0330214  3/1989  Euro. Pat. Off." should read
--0330214  8/1989  Euro. Pat. Off.--.
Other Publications,
In "Fukushima et al.,"
  "$Bi_2Sr_2Ca_{1-x}Y_xCa_2O_{8+\delta}$" should read
  --$Bi_2Sr_2Ca_{1-x}Y_xCu_2O_{8+\delta}$--,
In "Robinson," "$KBa_2Ca_{3-x}B_xO_2$" should read
  --$RBa_2Cu_{3-x}M_xO_z$--, and
In "Murphy," "Murphy" should read --Murphy D.W. et al.--.

AT [57] ABSTRACT

Line 5, "2>p>11," should read --$2 \leq p \leq 11$,--.

COLUMN 1

Line 7, "application of" (first occurrence) should read
  --application of Ser. No. 712,995. Jun. 10, 1991,
  now abandoned, which is a--.
Line 19, "*and SrBiCuOy*" should read --and SrBiCuOy--.
Line 37, "serious" should be deleted.

COLUMN 2

Line 57, "$Bi_{1-x}A^I_x)_2(Sr_yCa_{1-y-z}A^{II}_z)_p(Cu_{1-r}A^{II}_z)_p(Cu_{1-r}A^{III}_r)_qO_\delta$" should read
  --$Bi_{1-x}A^I_x)_2(Sr_yCa_{1-y-z}A^{II}_z)_p(Cu_{1-r}A^{III}_r)_qO_\delta$--.

UNITED STATES PATENT AND TRADEMARK OFFICE
CERTIFICATE OF CORRECTION

PATENT NO. : 5,565,414
DATED : October 15, 1996
INVENTOR(S) : JUN AKIMITSU ET AL.

It is certified that error appears in the above-identified patent and that said Letters Patent is hereby corrected as shown below:

COLUMN 3

Line 60, "3 k." should read 3 K.--.

COLUMN 4

Line 65, "IVb-$A^{III}$," should read --IVb; $A^{III}$,--.

COLUMN 5

Line 36, "sex out" should read --set out--.

COLUMN 6

Line 24, "tetragonal" should be deleted.

COLUMN 7

Line 8, insert lines 1-7 from Col. 8.

COLUMN 8

Line 39, $2X10^{-6}$ Tort" should read --$2X10^{-6}$ Torr--.
Line 45, "2:1.5:1.5=2" should read --2:1.5:1.5:2--.

COLUMN 9

Line 31, "1$\leq$y+z," should read --1>y+z,--.
Line 42, "oxygen-defected" should read --oxygen-deficient--.

UNITED STATES PATENT AND TRADEMARK OFFICE
CERTIFICATE OF CORRECTION

PATENT NO. : 5,565,414
DATED : October 15, 1996
INVENTOR(S) : JUN AKIMITSU ET AL.

It is certified that error appears in the above-identified patent and that said Letters Patent is hereby corrected as shown below:

COLUMN 10

Line 28, "$1<y+z+w,$" should read --$1>y+z+w,$--.
Line 41, "oxygen-deffective" should read --oxygen-deficient--.
Line 43, "$(Bi_2O_2)^+$" should read --$(Bi_2O_2)^{2+}$--.

Signed and Sealed this

Fifteenth Day of July, 1997

BRUCE LEHMAN

Attest:

Attesting Officer

Commissioner of Patents and Trademarks